United States Patent
Dengel et al.

(10) Patent No.: US 9,671,584 B2
(45) Date of Patent: Jun. 6, 2017

(54) METHOD AND COOLING SYSTEM FOR COOLING AN OPTICAL ELEMENT FOR EUV APPLICATIONS

(71) Applicant: Carl Zeiss SMT GmbH, Oberkochen (DE)

(72) Inventors: Guenther Dengel, Heidenheim an der Brenz (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 435 days.

(21) Appl. No.: 14/557,023

(22) Filed: Dec. 1, 2014

(65) Prior Publication Data

US 2015/0103426 A1    Apr. 16, 2015

Related U.S. Application Data

(63) Continuation of application No. PCT/EP2013/062862, filed on Jun. 20, 2013.
(Continued)

(30) Foreign Application Priority Data

Jun. 25, 2012   (DE) .................. 10 2012 210 712

(51) Int. Cl.
  *G02B 7/195*   (2006.01)
  *G02B 7/18*    (2006.01)
  *F25B 21/00*   (2006.01)

(52) U.S. Cl.
  CPC ............ *G02B 7/1815* (2013.01); *F25B 21/00* (2013.01); *F25B 2321/00* (2013.01)

(58) Field of Classification Search
  CPC .... G02B 7/181; G02B 7/1815; G02B 6/0085; G02B 5/0891; G02B 6/001; F25B 21/00;
(Continued)

(56) References Cited

U.S. PATENT DOCUMENTS 5,327,442 A   7/1994  Yarborough et al.
7,591,561 B2  9/2009  Phillips et al.
(Continued)

FOREIGN PATENT DOCUMENTS

DE    196 22 472 C1    12/1997
DE    19622472         12/1997
(Continued)

OTHER PUBLICATIONS

German Office Action, with translation thereof, for corresponding DE Appl No. 10 2012 210 712.6, dated Dec. 10, 2012.
(Continued)

*Primary Examiner* — Euncha Cherry
(74) *Attorney, Agent, or Firm* — Fish & Richardson P.C.

(57) ABSTRACT

A method for cooling an optical element for EUV applications is disclosed. Heat is transferred from the optical element to a heat sink, and, via a first feed line, a first cooling medium is introduced into a cooling channel in the heat sink, in such a way that the first cooling medium effects laminar flow through the cooling channel and in the process absorbs heat from the heat sink. After flowing through the cooling channel, the first cooling medium is discharged into a discharge line leading away from the optical element. A second cooling medium is introduced into the discharge line via a second feed line, and the first cooling medium and the second cooling medium, downstream of the second feed line at a location that is further away from the optical element than the cooling channel, are subjected to a force field introduced into the discharge line externally.

20 Claims, 1 Drawing Sheet

Related U.S. Application Data

(60) Provisional application No. 61/663,702, filed on Jun. 25, 2012.

(58) Field of Classification Search
CPC ............ F25B 2321/00; G03F 7/70891; G03F 7/70825; G03F 7/709
USPC ......................................................... 359/845
See application file for complete search history.

(56) References Cited

U.S. PATENT DOCUMENTS

| | | |
|---|---|---|
| 8,342,701 B2 | 1/2013 | Kierey et al. |
| 9,221,023 B2 | 12/2015 | Sugioka |
| 2006/0103955 A1 | 5/2006 | Griffith et al. |
| 2007/0091485 A1 | 4/2007 | Phillips et al. |
| 2008/0186696 A1* | 8/2008 | Awai ..................... G02B 6/001 362/92 |
| 2010/0220302 A1 | 9/2010 | Gischa |

FOREIGN PATENT DOCUMENTS

| | | |
|---|---|---|
| DE | 102 13 003 B4 | 8/2006 |
| EP | 2 546 897 | 1/2013 |
| JP | H 1-263471 | 10/1989 |
| JP | H 8-211211 | 8/1996 |
| JP | 2011-53687 | 3/2011 |
| JP | 2012-504323 | 3/2011 |
| JP | 2011-158332 | 8/2011 |

OTHER PUBLICATIONS

Japanese office action with English translation from parallel Japanese App. Ser. No. 2015-518988, issued on Feb. 10, 2017, 4 pages.
International Search Report for corresponding PCT/EP2013/062862, dated Sep. 11, 2013.
Melcom R. Howells, "Some fundamentals of cooled mirrors for synchrotron radiation beam lines," Opt. Eng. 35(4), pp. 1187-1197, Apr. 1996.

* cited by examiner

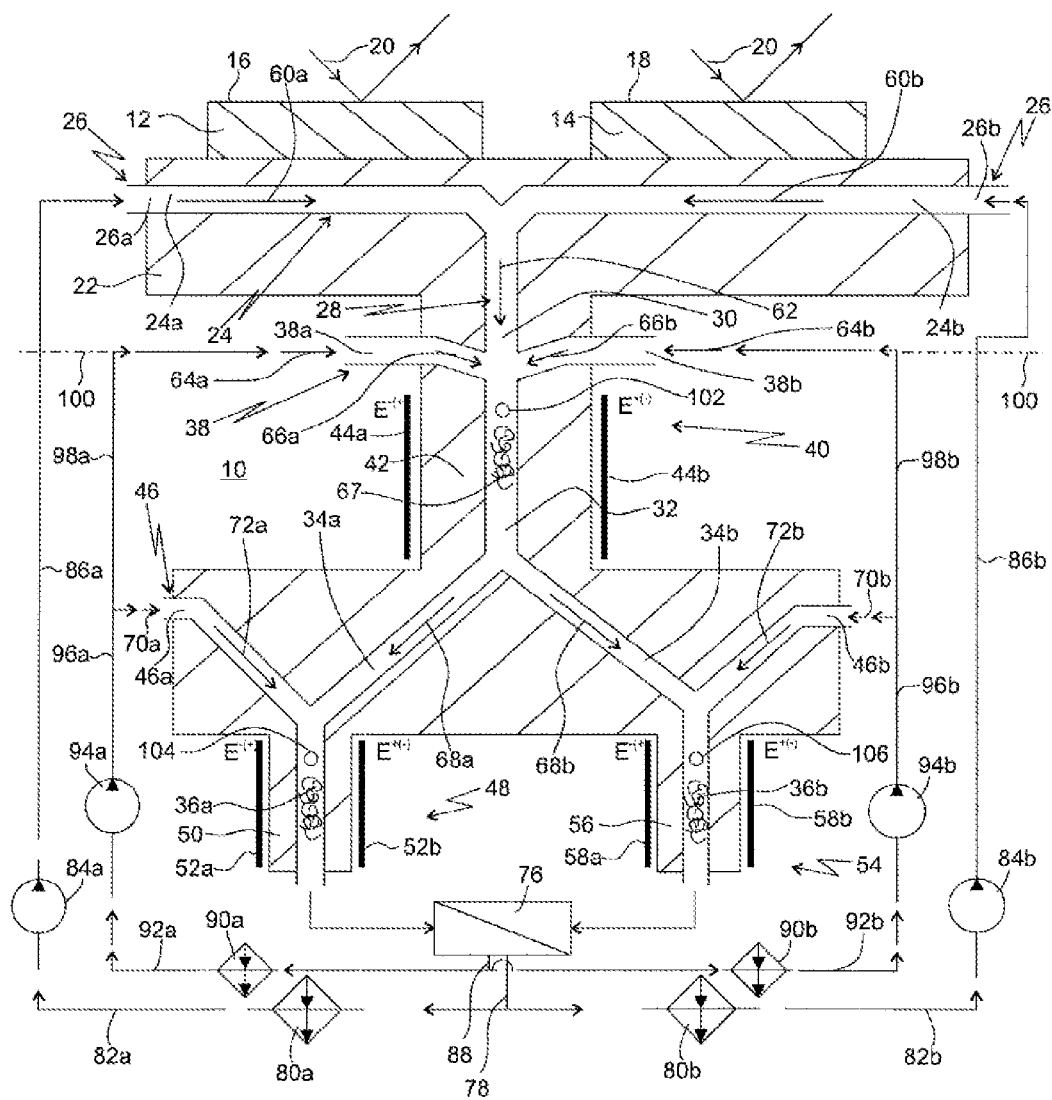

METHOD AND COOLING SYSTEM FOR COOLING AN OPTICAL ELEMENT FOR EUV APPLICATIONS

The present application is a continuation of, and claims benefit under 35 USC 120 to, international application PCT/EP2013/062862, filed Jun. 20, 2013, which claims benefit under 35 USC 119 of German Application No. 10 2012 210 712.6, filed Jun. 25, 2012. International application PCT/EP2013/062862 also claims priority under 35 USC 119(e) to U.S. Provisional Application No. 61/663,702, filed Jun. 25, 2012. The entire disclosure of international application PCT/EP2013/062862 and German Application No. 10 2012 210 712.6 are incorporated by reference herein.

The invention relates to a method for cooling an optical element for EUV applications, wherein heat is transferred from the optical element to a heat sink, and wherein, via a first feed line, a first cooling medium is introduced into a cooling channel in the heat sink, in such a way that the first cooling medium effects laminar flow through the cooling channel and in the process absorbs heat from the heat sink, wherein the first cooling medium, after flowing through the cooling channel, is discharged into a discharge line leading away from the optical element.

The invention furthermore relates to a cooling system for cooling an optical element for EUV applications, comprising a heat sink for transferring heat from the optical element to the heat sink, a cooling channel in the heat sink, and a first feed line for introducing a first cooling medium into the cooling channel, in such a way that the first cooling medium can effect laminar flow through the cooling channel and in the process absorb heat from the heat sink, and comprising a discharge line for the first cooling medium from the cooling channel, the discharge line leading away from the optical element.

A method and a cooling system of the type mentioned in the introduction are known from the document U.S. Pat. No. 7,591,561 B2.

An optical element for EUV applications is, for example, a mirror of an EUV projection exposure apparatus for microlithography.

A projection exposure apparatus for microlithography is used for example for producing finely structured electronic components. An EUV projection exposure apparatus operates with short-wave radiation, to be precise with radiation in the extreme ultraviolet, abbreviated to EUV radiation, the wavelength of which is in the range of approximately 5 nm to approximately 20 nm, for example.

In an optical element for EUV applications a technical problem that arises is that the optical element heats up to a great extent on account of being subjected to EUV radiation. The heat input into the optical element has the effect that the optical element can deform during operation. The deformation of an optical element can result in undesirable imaging aberrations of the projection exposure apparatus.

Therefore, cooling systems have been proposed which serve to dissipate from the optical element the heat input into the optical element during operation on account of the effect of the EUV radiation, in order to cool the optical element.

The document U.S. Pat. No. 7,591,561 B2 cited initially proposes providing, in a heat sink that is an integral part of the optical element, a plurality of cooling channels through which a cooling medium is guided, wherein the cooling medium effects laminar flow through the cooling channels.

It should be noted at this juncture that, within the meaning of the present invention, the heat sink can be an integral part of the optical element or a separate heat sink, to which the optical element is connected, preferably in a thermally conductive manner. Moreover, it goes without saying that, within the meaning of the present invention, the heat sink can have a plurality of cooling channels and/or discharge lines for cooling medium. In this respect, the potentially ambiguous German word "ein" ["a/an"; "one"] in the present description and in the claims should not be understood as the numeral, but rather as the indefinite article.

The laminar flow of the cooling medium in the cooling channel near the optical element has the advantage that no vibrations are introduced into the optical element by the flow of the cooling medium. Such vibrations would impair the optical properties of the optical element. By contrast, a laminar flow of the cooling medium has the disadvantage that the heat transfer to the cooling medium and the heat dissipation by the cooling medium is reduced in comparison with a turbulent flow of the cooling medium (see, for example, the article about fundamental principles by Melcom R. Howells in Opt. Eng. 35(4), pages 1187-1197, April 1996). By contrast, a turbulent flow of the cooling medium near the optical element causes vibrations in the optical element, while the heat dissipation is improved in comparison with the laminar flow.

Against this background, the invention is based on the object of developing a method and a cooling system of the type mentioned in the introduction to the effect that sufficient cooling of the optical element is ensured, without the cooling causing vibrations of the optical element.

According to the invention, this object is achieved with regard to the method mentioned in the introduction by virtue of the fact that a second cooling medium is introduced into the discharge line via a second feed line, and the first cooling medium and the second cooling medium, downstream of the second feed line at a location that is further away from the optical element than the cooling channel, are subjected to a force field introduced into the discharge line externally, in order to mix the first cooling medium and the second cooling medium with one another.

With regard to the cooling system mentioned in the introduction, the object on which the invention is based is achieved by virtue of the fact that a second feed line for introducing a second cooling medium into the discharge line opens into the discharge line, and that a mixing device for mixing the first cooling medium with the second cooling medium is arranged downstream of the second feed line outside the discharge line at a location that is further away from the optical element than the cooling channel, wherein the mixing device is designed for subjecting the first cooling medium and the second cooling medium to a force field introduced into the discharge line externally.

The method according to the invention and the cooling system according to the invention are based on the fact that the cooling medium effects laminar flow in the heat sink near the optical element, in order to prevent vibrations from being introduced into the optical element. In order to increase the heat transfer capability of the cooling medium, a second cooling medium is introduced into the discharge line at a greater distance from the optical element than the distance between the cooling channel and the optical element, wherein the first and second cooling media are mixed with one another in the discharge line by a force field coupled into the discharge line externally, in order thus to improve the heat dissipation. Via the force field acting in the discharge line, the first and second cooling media flowing in the discharge line are agitated, in other words, as a result of which the heat exchange area between the first and second cooling media is enlarged and the heat transfer capability of the mixture of first and second cooling media is significantly improved. It is true that the mixing of the first and second cooling media in the discharge line can lead to vibrations of the discharge line, but since the mixing of the first and second cooling media takes place at a greater distance from the optical element than the distance between the cooling channel in the heat sink and the optical element, vibrations in the mixing region are not transmitted to the optical element, or are transmitted to the latter to a small extent at most. If appropriate, the discharge line can be vibration-decoupled from the heat sink in the region of action of the force field.

A force field introduced into the discharge line externally can be for example an externally applied pressure gradient, an electric and/or magnetic field, an acoustic field and the like. Such force fields introduced into the discharge line externally have the advantage over mechanical mixing via stirring mechanisms that there are no restrictions for the dimensioning of the discharge line, that is to say that the discharge line can be embodied with a very small cross section in the range of a few millimeters or less than one millimeter.

The second cooling medium can be fed into the discharge line in a manner dependent on the required cooling capacity. If the cooling of the optical element with the laminar flow of the cooling medium in the cooling channel is sufficient, the supply of the second cooling medium can also be switched off, e.g. via controlled valves.

In one preferred configuration of the method, the first cooling medium and the second cooling medium with one another form an electrical double layer or the first and/or the second cooling medium with a wall of the discharge line form an electrical double layer, wherein the first cooling medium and the second cooling medium are subjected to an alternating electric field as force field, the alternating electric field acting through the wall of the discharge line.

In the case of the cooling system, the first cooling medium and the second cooling medium are correspondingly preferably suitable for forming with one another an electrical double layer, or the first cooling medium and/or the second cooling medium are/is suitable for forming with a wall of the discharge line an electrical double layer, wherein the mixing device is designed for subjecting the first cooling medium and the second cooling medium to an alternating electric field as force field, the alternating electric field acting through the wall of the discharge line.

A mixer for mixing two or more liquids which uses electrical double layers between liquid and wall or liquid and liquid is described in the document DE 102 13 003 B4. The mixer described therein is used in microfluidics in the chemical, pharmaceutical or biochemical process industry. In the context of the above configuration, it is possible, then, to make use of the effect that, with an appropriate choice of cooling medium, the first cooling medium and the second cooling medium with one another can form an electrical double layer, or the first and/or the second cooling medium with the wall of the discharge line can form an electrical double layer, on which the oscillating alternating electric field acting externally through the wall of the discharge line exerts forces that lead to agitation and thus mixing of the first and second cooling media and to the enlargement of the heat exchange area. The advantage of an alternating electric field as force field is that the strength of the alternating electric field and thus the agitation intensity can easily be controlled.

It goes without saying that the wall of the discharge line is not electrically conductive at least in the region of action of the alternating electric field and therefore does not have a shielding effect relative to the alternating electric field.

Preferably, the field lines of the alternating electric field run approximately perpendicularly to the flow direction of the first and second cooling media in the discharge line.

With further preference, in the method according to the invention, the strength of the force field is set such that the flow of the first cooling medium and of the second cooling medium in the discharge line is turbulent.

In the case of the cooling system, accordingly the strength of the force field is adjustable in order to produce a turbulent flow of the first cooling medium and of the second cooling medium in the discharge line.

As already mentioned above, the heat transfer by a turbulent flow is improved in comparison with a laminar flow. Owing to the greater distance between the region of turbulent flow in the discharge line and the optical element, vibrations produced by the turbulent flow cannot subsequently act on the optical element, wherein, if appropriate, vibration decoupling of the turbulent flow region from the optical element can additionally be provided as well.

The invention thus preferably provides cooling with two cooling circuits, to be precise a laminar cooling circuit for absorbing heat in direct proximity to the optical element, and with a turbulent cooling circuit at a greater distance from the optical element.

In a further preferred configuration of the method, at least one third cooling medium is fed into the discharge line via at least one third feed line downstream of the second feed line, and the mixture of the first and second cooling media and the at least one third cooling medium are subjected to a force field introduced into the discharge line externally, in order to mix the mixture of first and second cooling media and the at least one third cooling medium with one another.

In the case of the cooling system, preferably at least one third feed line opens into the discharge line downstream with respect to the second feed line, in order to introduce at least one third cooling medium into the discharge line, and at least one further mixing device for mixing the mixture of first and second cooling media with the third cooling medium is arranged downstream of the second feed line outside the discharge line, wherein the mixing device is designed for subjecting the mixture of first and second cooling media and the third cooling medium to a force field introduced into the discharge line externally.

This configuration of the cooling system and of the method therefore provides a cascade of feed lines for cooling media into the discharge line, resulting in a further improvement in the heat transfer and thus even better cooling of the optical element. The third cooling medium together with the mixture of first and second cooling media that is present in the discharge line is agitated by the externally acting force field, wherein here, too, the agitation can be such that the flow of the mixture of first and second cooling media and third cooling medium becomes turbulent.

In the case, too, of the configuration of the cooling system with a cascade of feed lines of cooling medium into the discharge line, use is preferably made of the effect that with a suitable choice of cooling medium, an electrical double layer can form between the mixture of first and second cooling media and the at least one third cooling medium with one another, or an electrical double layer can form between the mixture of first and second cooling media and/or the third cooling medium and the wall of the discharge line, wherein as force field an alternating electric field acts on the electrical double layer through the wall of the discharge line.

In the case of the method and the cooling system, the first cooling medium and the second cooling medium and, if appropriate, the at least one third cooling medium can be identical liquids.

The advantage here is that the cooling system overall can be implemented with less outlay; in particular, in the case where the cooling media are again fed to the corresponding first, second and third feed lines in a cooling medium circuit after heat dissipation, for example in a heat exchanger, it is not necessary for the cooling media to be separated before again being fed into the corresponding feed line.

However, provision can also be made for the first cooling medium and the second cooling medium and/or, if appropriate, the at least one third cooling medium to be different liquids.

As a result, although the cooling system can involve a higher outlay than in the case of the configuration mentioned above, this configuration can afford the advantage that liquids which are different with regard to their electrolytic properties are used, which form an electrical double layer at their mutual boundary layer, such that, in the case where the cooling media are subjected to an alternating electric field, the liquids react particularly well to the alternating electric field and a greater unfolding of the interface between the cooling media and thus an improved mixing and thus increased heat transfer are achieved.

In the case of the abovementioned configuration, in the case of the method, the first cooling medium and the second cooling medium and/or if appropriate, the at least one third cooling medium are separated from one another after flowing through the discharge line and before they are again fed to the first and second and/or, if appropriate, the at least one third feed line.

The cooling system correspondingly has for this purpose a separating device between the discharge line and the first, second and/or, if appropriate, the at least one third feed line.

Via the separating device, the different cooling media, as in the case of identical cooling media, can circulate in a closed cooling medium circuit, that is to say that after the separation of the first, second and/or if appropriate, at least one third cooling medium, they can be fed again in a manner separated from one another to the feed lines assigned to them.

In a further preferred configuration of the cooling system, at least one flow obstacle is arranged in the discharge line in the region of action of the force field.

Such a flow obstacle can be for example a pin having a round or angular cross section, which extends with its longitudinal axis perpendicular to the main flow direction in the discharge line. In interaction with the force field, the at least one flow obstacle further improves the mixing of the cooling media; in particular, the active region of the force field in the direction of the main flow direction of the cooling media can be made shorter on account of the presence of the at least one flow obstacle, in particular if the at least one flow obstacle is situated at the beginning of the section of action of the force field.

In a further preferred configuration of the cooling system, the cooling channel and/or the discharge line have/has in at least one dimension a clear width of 1 mm or less.

As already mentioned, in the case of the cooling system according to the invention and the method according to the invention, it is possible to provide more than just one cooling channel in the heat sink and also more than just one discharge line from the cooling channel or channels. Furthermore, it is possible within the scope of the invention to integrate the heat sink into the optical element; for example, in the case where the optical element is a mirror, the heat sink can be formed by the substrate of the mirror or be integrated into the latter.

Further advantages and features are evident from the following description and the accompanying drawing.

It goes without saying that the features mentioned above and those yet to be explained below can be used not only in the combination respectively indicated, but also in other combinations or by themselves, without departing from the scope of the present invention.

An exemplary embodiment of the invention is illustrated in the drawing and is described here in even greater detail with reference to the drawing. The single FIG. 1 shows a cooling system for an optical element.

FIG. 1 schematically shows a cooling system—provided with the general reference sign 10—for an optical element 12 and, in the exemplary embodiment shown, a further optical element 14.

The optical element 12 and the optical element 14 are designed for EUV applications. The optical element 12 and the optical element 14 are for example mirrors of an EUV projection exposure apparatus for microlithography.

The optical element 12 has a radiation incidence side 16, and the optical element 14 has a radiation incidence side 18. During the operation of the optical elements 12 and 14, the latter are subjected to EUV radiation 20.

The EUV radiation 20 leads to a heat input into the optical elements 12 and 14, wherein the cooling system 10 serves for cooling the optical elements 12 and 14 by dissipating heat from the optical elements 12 and 14.

The cooling system 10 has a heat sink 22, to which the optical elements 12 and 14 are thermally conductively connected. In this case, the optical elements 12 and 14 are mechanically fixed on the heat sink 22, wherein heat is transferred from the optical elements 12 and 14 to the heat sink 22 by conduction. In this case, the thermal conductivity is essentially dependent on the contact pressure of the optical elements 12 and 14 on the heat sink 22 and the materials used. By way of example, copper, steel, silicon or quartz are possible as materials for the optical elements 12 and 14, and the heat sink 22 can be produced from an electrically non-conductive material such as ceramic, for example SiC, SSiC and the like. However, the heat sink 22 can also be composed of a metal, in particular copper, aluminum or steel. The material of the heat sink 22 can be chosen in an application-specific manner, the choice of material being made for example so as to achieve an adaptation of the coefficient of thermal expansion to that of the optical elements 12, 14, an optimization of the heat conduction, etc.

Instead of a mechanical connection of the optical elements 12 and 14 to the heat sink 22, it is likewise possible for the heat sink 22 to be integrated into the optical elements 12 and 14; by way of example, in the case where the optical elements 12 and 14 are mirrors, the heat sink 22 can be integrated into the respective mirror substrate. Moreover, instead of the arrangement shown here, in which a common heat sink 22 is assigned to the optical elements 12 and 14, it is possible to assign a dedicated heat sink to each optical element 12 and 14.

A cooling channel 24 is present in the heat sink 22, the cooling channel having a first section 24a and a second section 24b in the exemplary embodiment shown. Generally a feed line 26 opens into the cooling channel. In accordance with the two sections 24a and 24b, a feed line 26a and a feed line 26b are present. The cooling channel is situated in direct proximity to the optical elements 12, 14.

A discharge line 28 exits from the cooling channel 24, to put it more precisely the sections 24a and 24b of the cooling channel 22, the discharge line leading away from the optical elements 12 and 14. In the exemplary embodiment shown, the discharge line 28 leads away perpendicularly to the cooling channel 24 and leads away from the optical elements 12 and 14 perpendicularly, but it is also possible for the discharge line 30 to lead away from the optical elements 12 and 14 laterally, that is to say in a manner substantially parallel to the cooling line 24.

In the exemplary embodiment shown, the discharge line 28 has a first section 30, a section 32 adjacent thereto, two branching sections 34a and 34b adjacent thereto, and further sections 36a and 36b adjacent thereto.

A second feed line 38 opens into the discharge line 28 between the first section 30 and the second section 32 of the discharge line 28, wherein two second feed lines 38a and 38b open into the discharge line 28 between the section 30 and section 32 thereof in the exemplary embodiment shown.

Downstream of the feed line 38, the cooling system 10 has a first mixing device 40, which is arranged outside the discharge line 28, here outside the second section 32 of the discharge line 28. The mixing device 40 is arranged at a location that is further away from the optical element 12 or from the optical element 14 than the cooling channel 24, as is evident from FIG. 1.

The mixing device 40 is designed to generate a force field which acts through a wall 42 of the discharge line 28, here of the second section 32 of the discharge line 28, into the interior of the discharge line 28.

In this case, the mixing device 40 generates an alternating electric field as force field and for this purpose has two electrodes 44a and 44b, which are situated opposite one another in the manner of a plate capacitor. As a result of an AC voltage being applied to the electrodes 44a and 44b, an alternating electric field is generated in the space between the electrodes 44a and 44b, as is illustrated by $E^{-(+)}$ and $E^{+(-)}$. In this case, the field lines of the alternating electric field run perpendicularly to the discharge line 28, to put it more precisely to the second section 32 of the discharge line 28.

In the further course of the discharge line 28, that is to say downstream of the second section 32 of the discharge line 28, a third feed line 46 opens into the discharge line 28. In the exemplary embodiment shown, two third feed lines 46a and 46b are present, wherein the third feed line 46a opens into the section 34a of the feed line 28 and the third feed line 46b opens into the section 34b of the discharge line 28.

Downstream of the opening of the third feed line 46a into the section 44a of the discharge line 28, the cooling system 10 has a second mixing device 48, which is designed to generate a force field in order to act through the wall, here a wall section 50 of the section 36a of the discharge line 28 into the interior of the discharge line 28, here of the section 36a of the discharge line 28. As in the case of the mixing device 40, the mixing device 48 generates an alternating electric field as force field and has two electrodes 52a and 52b for this purpose. Here, too, the alternating electric field generated by the mixing device 48 acts perpendicularly to the discharge line 28, to put it more precisely perpendicularly to the section 36a of the discharge line 28.

In the same way, a further mixing device 54 is arranged downstream of the opening of the third feed line 46b into the section 34b of the discharge line 28, the further mixing device generating a force field that acts through a wall section 56 into the interior of the discharge line 28, here of the section 36b of the discharge line 28. In the same way as the mixing device 40, the mixing device 54 generates an alternating electric field as force field and has two electrodes 58a and 58b for this purpose. In this case, the alternating electric field acts perpendicularly to the section 36b of the discharge line 28.

It goes without saying that at least the wall sections 42, 50 and 56 of the discharge line 28 are produced from an electrically non-conductive material, such that the abovementioned alternating electric fields generated by the mixing devices 40, 48 and 54 are not shielded by the wall sections 42, 50 and 56.

A method for cooling the optical elements 12 and 14, which method can be carried out with the cooling system 10, and also further components of the cooling system 10 are described below.

In a method for cooling the optical elements 12 and 14, via the first feed lines 26a and 26b, a first cooling medium is introduced into the cooling channel 24, here the sections 24a and 24b. In this case, the first cooling medium is introduced into the cooling channel 24 such that the first cooling medium effects laminar flow in the cooling channel 24. As a criterion for a laminar flow, the Reynolds number is used, which is dependent on the characteristic flow velocity of the cooling medium, the characteristic length of the cooling channel 24, the kinematic viscosity or the dynamic viscosity and the density of the cooling medium. Starting from a critical value of the Reynolds number, a laminar flow becomes unstable with respect to small disturbances. In the case of a pipe flow, the critical value of the Reynolds number is approximately 2300. In order to ensure that the flow of the first cooling medium in the cooling channel 24 is strictly laminar, Reynolds numbers of less than or equal to 500 should be striven for.

However, the Reynolds number by itself is not sufficient for exactly determining a laminar flow or the transition to turbulent flow. The friction of the cooling medium at the inner wall of the cooling channel 24 is also of significant importance here.

The laminar flow of the first cooling medium in the sections 24a and 24b of the cooling channel 24 is indicated by arrows 60a and 60b.

The first cooling medium, after flowing through the cooling channel 24, is then discharged into the discharge line 28, wherein the flow of the first cooling medium is still laminar in the section 30, as is indicated by an arrow 62. In the discharge line 28, the first cooling medium is discharged away from the optical elements 12 and 14.

If the cooling capacity of the laminar flow of the first cooling medium is not sufficient for cooling the optical elements 12 and 14 as desired, a second cooling medium is introduced into the discharge line 28 via the second feed line 38, here the feed lines 38a and 38b, in accordance with an arrow 64a and respectively 64b and further arrows 66a, 66b.

The first cooling medium and the second cooling medium, which flow jointly into the section 32 of the discharge line 28, are suitable for forming an electrical double layer with one another, or the first cooling medium and/or the second cooling medium are/is suitable for forming an electrical double layer with the wall 42 of the section 32 of the discharge line 28.

The first cooling medium and the second cooling medium can form an electrical double layer with one another if the first cooling medium and the second cooling medium are different liquids having different electrolytic properties, for example the first cooling medium is water and the second cooling medium is an alcohol, an aqueous solution, a salt solution or an organic liquid. The electrical double layer will then form at the interface between the two cooling media.

If the first cooling medium and the second cooling medium are identical liquids, with appropriate choice of material for the wall 42 of the section 32 of the discharge line 28 and appropriate choice of the liquid, an electrical double layer will form at least at the boundary layer of the respective cooling medium with respect to the wall 42 of the discharge line 28.

In the section 32 of the discharge line 28, the alternating electric field generated by the mixing device 40 then acts on the electrical double layer, to be precise perpendicularly to the main flow direction of the first and second cooling media, thereby bringing about an unfolding of the interface between the first cooling medium and the second cooling medium. As a result of the unfolding of the boundary layer between the first cooling medium and the second cooling medium, these two cooling media are intimately mixed with one another and the heat exchange area is correspondingly enlarged.

In this case, the strength of the alternating electric field generated by the mixing device 40 is adjustable, wherein the strength of the alternating electric field can occasionally be set such that the flow of the first and second cooling media in the section 32 of the discharge line 28 becomes turbulent, as is indicated by vortex lines 67. The strong agitation of the first and second cooling media thus produces a turbulent flow in the section 32 of the discharge line 28, the turbulent flow intensifying the heat transfer by the cooling medium.

The mixture of first and second cooling media flows from the section 32 of the discharge line 28 in accordance with the branching of the discharge line 28 into the sections 34a and 34b. In the sections 34a and 34b of the discharge line 28, the flow of the mixture of first and second cooling media is once again laminar, as is indicated by arrows 68a and 68b.

Via the third feed lines 46a and 46b, in the case where the cooling capacity is intended to be increased even further, a third cooling medium is introduced in accordance with arrows 70a, 72a and 70b, 72b, respectively, such that the mixture of first cooling medium and second cooling medium and the third cooling medium jointly flow into the further section 36a and respectively 36b of the discharge line 28.

Depending on the constitution of the mixture of first and second cooling media and of the third cooling medium, the mixture of first and second cooling media and the third cooling medium again form an electrical double layer with one another, or the mixture of first and second cooling media and/or the third cooling medium form(s) an electrical double layer with the wall 50 and 56 of the section 36a and 36b, respectively, of the discharge line 28. Via the mixing device 48 and respectively the mixing device 54, the separating layer between the mixture of first and second cooling media and the third cooling medium is unfolded again, such that a mixing takes place and, depending on the set strength of the alternating electric field generated by the mixing device 48 and respectively by the mixing device 54, the flow of the mixture of first and second cooling media and third cooling medium in the section 36a and respectively 36b is turbulent.

In the exemplary embodiment shown, the second cooling medium is the same liquid as the third cooling medium, but it is also possible for the second cooling medium and the third cooling medium to be different liquids.

In the exemplary embodiment shown, the first cooling medium is a first liquid, and the second cooling medium and the third cooling medium are an identical second liquid. The first cooling medium is water, for example, and the second and third cooling media are an alcohol, a salt solution, an organic liquid or the like.

In this case, a separating device 76 is disposed downstream of the discharge line 28, the first liquid being separated from the second liquid in the separating device. From the separating device 76, via a first line 78, the first liquid (first cooling medium) is fed to first heat exchangers 80a and 80b for dissipating heat from the first cooling medium and for conditioning the first cooling medium. The heat exchangers are situated in an external machine unit, for example. Via further first lines 82a and 82b and pump units 84a and 84b and also further first lines 86a and 86b, the first cooling medium is again fed to the feed lines 26a and 26b into the cooling channel 24. In this way, the first cooling medium circulates according to a first circuit, which forms a laminar cooling circuit owing to the laminar flow of the cooling medium in the cooling channel 24.

The second liquid, which in the present case forms the second and third cooling media, is fed, proceeding from the separating device 76, via a second line 88 to external second heat exchangers 90a, 90b for heat dissipation and conditioning, and, via further second lines 92a, 92b, second pump units 94a, 94b and further second lines 96a, 96b, the second liquid is again fed to the feed lines 46a, 46b into the discharge line 28 and, via still further second lines 98a and 98b, to the feed lines 38a, 38b into the discharge line.

Switchable valves can be arranged in the lines 96a, 96b, likewise in the lines 98a and 98b, such that the feeding of the second and third cooling media to the feed lines 38a, 38b and 46a, 46b, respectively, can be switched on, switched off or throttled as necessary, that is to say according to the required cooling capacity.

The second liquid, which in the present case forms the second and third cooling media, thus circulates in a second cooling circuit, which forms a turbulent cooling circuit on account of the mixing devices 40, 48 and 54 and the possibility for producing a turbulent flow in the sections 32, 36a and 36b of the discharge line 28.

In FIG. 1, a line 100 indicates a separating line above which the laminar region of the cooling system 10 is situated and below which the turbulent region of the cooling system 10 is situated. Since the turbulent region is situated at a distance from the optical elements 12 and 14, vibrations on account of the possible turbulent flow of cooling medium from this region are not transmitted to the optical elements 12 and 14, or are transmitted to the latter at least to a lesser extent. Vibration decoupling of the turbulent region from the laminar region can additionally be provided as well.

In the exemplary embodiment shown, flow obstacles 102, 104 and 106 are furthermore situated in the sections 32, 36a and 36b of the discharge line 28, which flow obstacles, in interaction with the alternating electric fields generated by the mixing devices 40, 48 and 54, intensify still further the mixing of the first cooling medium with the second cooling medium or the mixture of first and second cooling media with the third cooling medium and thus improve the heat dissipation even further.

The first cooling medium and the second and respectively third cooling medium are fed into the feed lines 26, 38 and 46 for example with a flow rate in the range of approximately 1 sl/min to approximately 5 sl/min, the flow rate preferably being approximately 3 sl/min, where sl is a standard liter.

The entire wall surrounding the discharge line 28 can be formed integrally with the heat sink 22, and for example likewise be produced from a ceramic, for example SiC, SSiC or the like.

The liquids used as first, second and third cooling media can be chosen as desired, provided that they are suitable for forming an electrical double layer with the wall of the discharge line or with one another. Examples of liquids used can include water, aqueous solutions, salt solutions, alcohols or organic liquids.

The electric field strength generated by the mixing devices 40, 48 and 54 is preferably in the region of 1 V/mm to approximately 500 V/mm.

The cooling channel 24 and/or the discharge line 28 have/has in at least one dimension preferably a clearance of less than 1 mm, preferably a clear width in the range of approximately 50 μm to 800 μm.

The invention claimed is:

1. A method, comprising:
  a) transferring heat from an optical element to a heat sink;
  b) introducing a first cooling medium into a first cooling channel of the heat sink so that the first cooling medium has laminar flow through the cooling channel and absorbs heat from the heat sink;
  c), after b), discharging the first cooling medium into a discharge line leading away from the optical element;
  d) introducing a second cooling medium into the discharge line via a second feed line;
  e) downstream of the second feed line at a location that is further from the optical element than the cooling channel, subjecting the first and second cooling media to a force field externally introduced into the discharge line so that the first and second cooling media mix with each other.

2. The method of claim 1, wherein:
  the force field comprises an alternating electric field that acts through a wall of the discharge line; and
  the method further comprises at least one of the following:
    forming an electrical double layer comprising the first and second cooling media;
    forming an electrical double layer comprising the first cooling medium and the wall of the discharge line; and
    forming an electrical double layer comprising the second cooling medium and the wall of the discharge line.

3. The method of claim 1, further comprising setting a strength of the force field so that the flow of the first and second cooling media in the discharge line is turbulent.

4. The method of claim 1, wherein the force field acts perpendicularly to the discharge line.

5. The method of claim 1, further comprising:
  feeding a third cooling medium into the discharge line via a third feed line downstream of the second feed line; and
  subjecting the first, second and third cooling media to a second force field which is externally introduced into the discharge line to mix the mixture of first, second and third cooling media with each other.

6. The method of claim 5, wherein:
  the second force field comprises an alternating electric field that acts through a wall of the discharge line; and
  the method further comprises at least one of the following:
    forming an electrical double layer comprising a mixture of first, second and third cooling media;
    forming an electrical double layer comprising the mixture of first and second cooling media and a wall of the discharge line; and
    forming an electrical double layer comprising the third cooling medium and a wall of the discharge line.

7. The method of claim 1, wherein the first cooling medium is the same as the second cooling medium.

8. The method of claim 1, wherein the first cooling medium is different from the second cooling medium.

9. The method of claim 8, further comprising separating the first and second cooling media from each other after flowing through the discharge line and before they are again fed to the first and second feed lines.

10. A system, comprising:
  an optical element;
  a heat sink comprising a cooling channel, the heat sink configured so that, during use, heat is transferred from the optical element to the heat sink;
  a first feed line configured to introduce a first cooling medium into the cooling channel so that, during use, the first cooling medium has laminar flow through the cooling channel to absorb heat from the heat sink; and
  a discharge line configured to discharge the first cooling medium from the cooling channel, the discharge line leading away from the optical element;
  a second feed line having configured to introduce a second cooling medium into the discharge line, the second feeding line opening into the discharge line; and
  a mixing device configured to mix the first and second cooling media, the mixing device being downstream of the second feed line outside the discharge line at a location that is further away from the optical element than the cooling channel,
  wherein the mixing device is configured so that, during use, the first and second cooling media are subjected to a force field that is externally introduced into the discharge line.

11. The cooling system of claim 10, wherein:
  the force field comprises an alternating electric field that acts through a wall of the discharge line; and
  at least one of the following holds:
    the first and second cooling media are suitable to form an electrical double layer with each other;
    the first cooling medium is suitable to form an electrical double layer with the wall of the discharge line; and
    the second cooling medium is suitable to form an electrical double layer with the wall of the discharge line.

12. The cooling system of claim 10, wherein a strength of the force field is adjustable to produce a turbulent flow of the first and second cooling media in the discharge line.

13. The cooling system of claim 10, wherein the mixing device is configured to generate the force field perpendicular to the discharge line.

14. The cooling system of claim 10, further comprising:
  a third feed line; and
  a second mixing device downstream of the second feed line,
  wherein:
    the third feed line opens into the discharge line downstream of the second feed line to introduce a third cooling medium into the discharge line;
    the second mixing device is configured to mix the first, second and third cooling media; and
    the second mixing device is configured so that, during use, the first, second and third cooling media are subjected to a second force field that is externally introduced into the discharge line.

15. The cooling system of claim 14, wherein:
the second force field comprises an alternating electric field that acts through a wall of the discharge line; and
at least one of the following holds:
the mixture of first, second and third cooling medium are suitable to form an electrical double layer with each other;
the mixture of first and second cooling media is suitable to form an electrical double layer with a wall of the discharge line; and
the third cooling medium is suitable to form an electrical double layer with a wall of the discharge line.

16. The cooling system of claim 10, wherein the first cooling medium is the same as the second cooling medium.

17. The cooling system of claim 10, wherein the first cooling medium is different from the second cooling medium.

18. The cooling system of claim 17, further comprising a separating device configured to separate the first cooling medium and the second cooling medium.

19. The cooling system of claim 10, further comprising a flow obstacle in the discharge line in a region of action of the force field.

20. The cooling system of claim 10, wherein at least one element has a clear width of one millimeter or less, and the at least one element comprises a member selected from the group consisting of the cooling channel and the discharge line.

* * * * *

UNITED STATES PATENT AND TRADEMARK OFFICE
CERTIFICATE OF CORRECTION

| | |
|---|---|
| PATENT NO. | : 9,671,584 B2 |
| APPLICATION NO. | : 14/557023 |
| DATED | : June 6, 2017 |
| INVENTOR(S) | : Guenther Dengel and Joachim Hartjes |

It is certified that error appears in the above-identified patent and that said Letters Patent is hereby corrected as shown below:

In the Specification

Column 1, Line 4, under "METHOD AND COOLING SYSTEM FOR COOLING AN OPTICAL ELEMENT FOR EUV APPLICATIONS", insert -- CROSS-REFERENCE TO RELATED APPLICATIONS -- as a heading.

In the Claims

Column 11, Line 25, Claim 1, delete "c)," and insert -- c) --.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*